United States Patent [19]

Hohn

[11] Patent Number: 4,468,586
[45] Date of Patent: Aug. 28, 1984

[54] SHAPED ELECTRON EMISSION FROM SINGLE CRYSTAL LANTHANUM HEXABORIDE WITH INTENSITY DISTRIBUTION

[75] Inventor: Fritz-Jürgen Hohn, Armonk, N.Y.

[73] Assignee: International Business Machines Corporation, Armonk, N.Y.

[21] Appl. No.: 267,320

[22] Filed: May 26, 1981

[51] Int. Cl.³ .......................... H01J 1/16; H01J 19/10
[52] U.S. Cl. .................................. 313/336; 313/346 R; 252/521; 445/50
[58] Field of Search ...................... 313/336, 337, 346; 29/25.14, 25.17; 252/521

[56] References Cited

U.S. PATENT DOCUMENTS

| 3,631,290 | 12/1971 | Loeffler | 313/341 |
| 4,054,946 | 10/1977 | Ferris et al. | 313/336 |
| 4,055,780 | 10/1977 | Kawai et al. | 313/336 |
| 4,363,995 | 12/1982 | Takigawa et al. | 313/326 |

FOREIGN PATENT DOCUMENTS

| 0030465 | 6/1981 | European Pat. Off. | 313/336 |
| J51041-951 | 4/1976 | Japan | 313/336 |
| JA0030151 | 3/1977 | Japan | 313/336 |
| JA0031650 | 3/1977 | Japan | 313/336 |
| JA0051473 | 4/1979 | Japan | 313/336 |
| JA0024371 | 2/1980 | Japan | 313/336 |
| JA0088233 | 7/1980 | Japan | 313/336 |
| EP0030465 | 6/1981 | Japan | 313/336 |
| 56-93244 | 7/1981 | Japan | 313/336 |
| 1210007 | 10/1970 | United Kingdom | 313/336 |
| 1433944 | 4/1976 | United Kingdom | 313/336 |

Primary Examiner—Saxfield Chatmon
Attorney, Agent, or Firm—Ronald L. Drumheller

[57] ABSTRACT

The shape of an electron beam emitted from an $LaB_6$ single crystal cathode can be controlled directly by shaping the cathode tip itself. The $LaB_6$ cathode is provided with a flat top surface which is substantially perpendicular to the emitted beam direction and which corresponds in shape to the shape of the beam desired. For a square beam the flat top surface is square in shape. The size of the shaped top surface and operating conditions are arranged such that emission of electrons occurs over substantially the entire shaped top surface with minimum emission from side regions of the tip adjacent to this shaped surface. In order to maximize emission from the shaped top surface, a crystallographic orientation is selected such that the shaped top surface exposes a relatively low work function crystal plane. Emission from side regions of the tip adjacent to the shaped high emission surface may be reduced by orienting such side regions very obliquely to the emitted beam axis. The side regions may also be flat surfaces, in which case emission from these flat side surfaces may be reduced by orienting the flat side surfaces such that they expose relatively high work function crystal plane.

57 Claims, 28 Drawing Figures

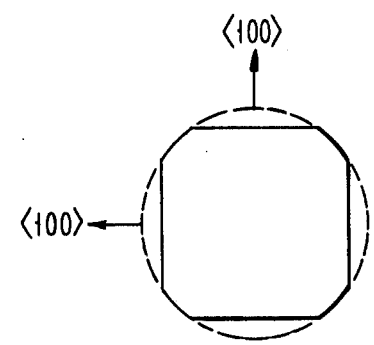
FIG. 1.1
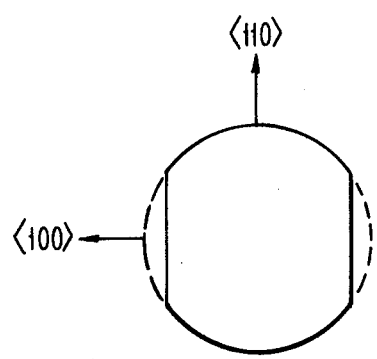
FIG. 1.2
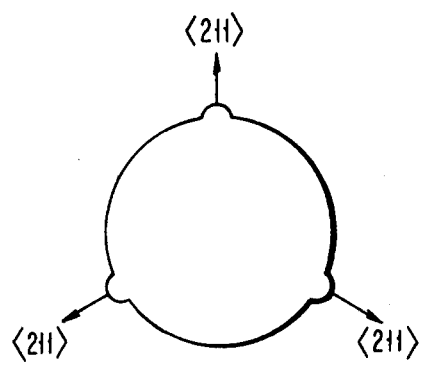
FIG. 1.3

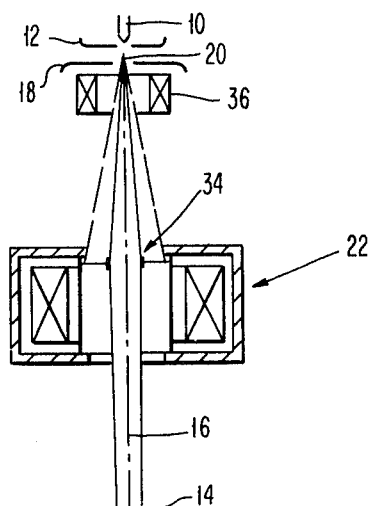
FIG. 2.1
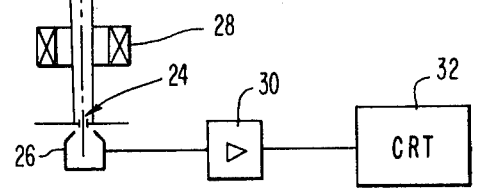
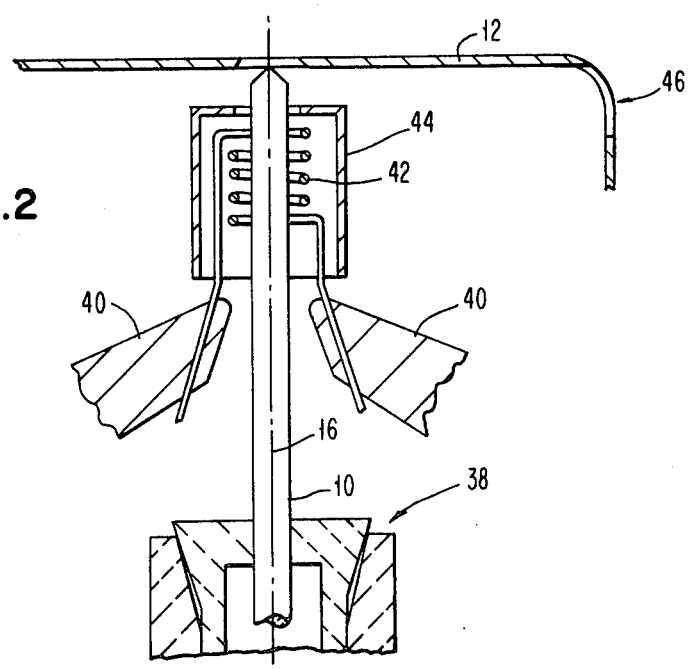
FIG. 2.2

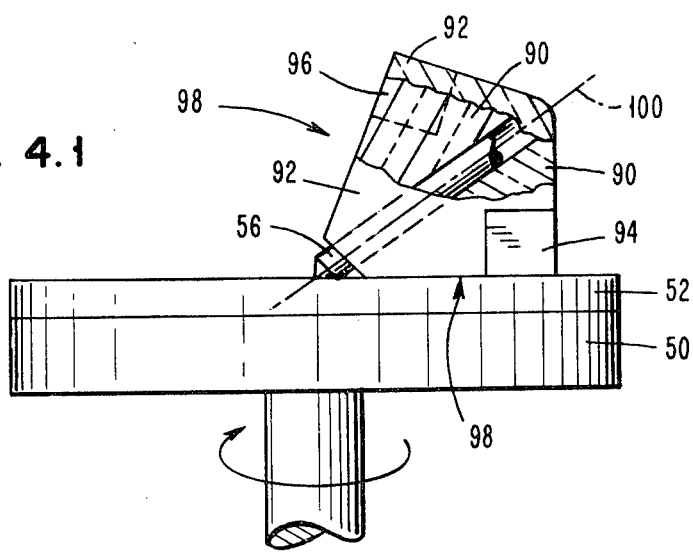
FIG. 4.1
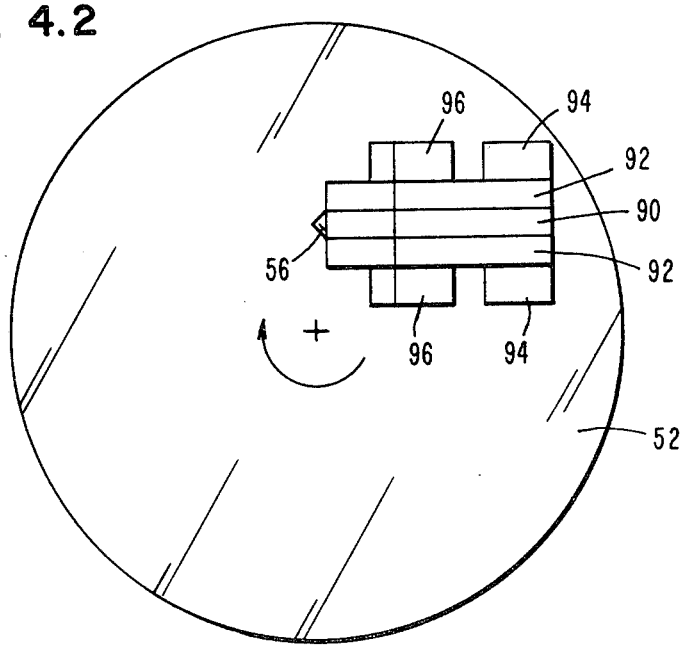
FIG. 4.2

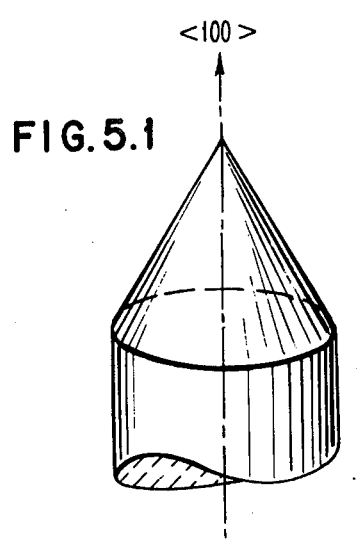
FIG. 5.1
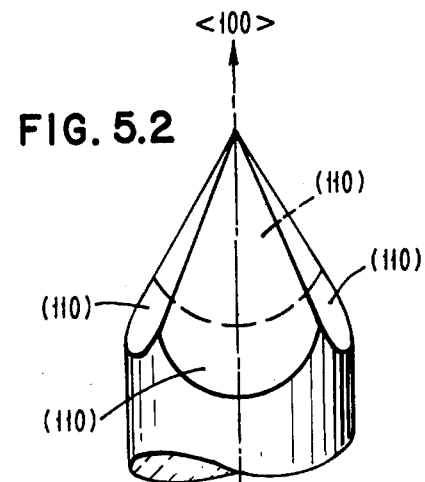
FIG. 5.2
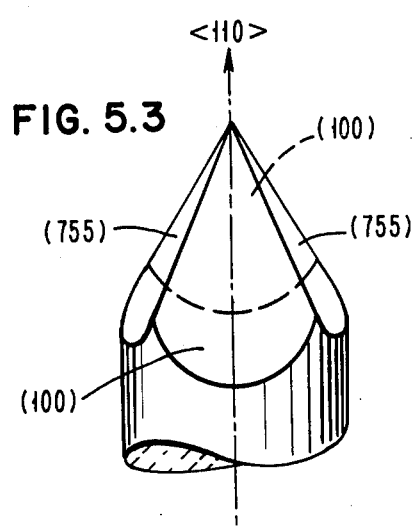
FIG. 5.3
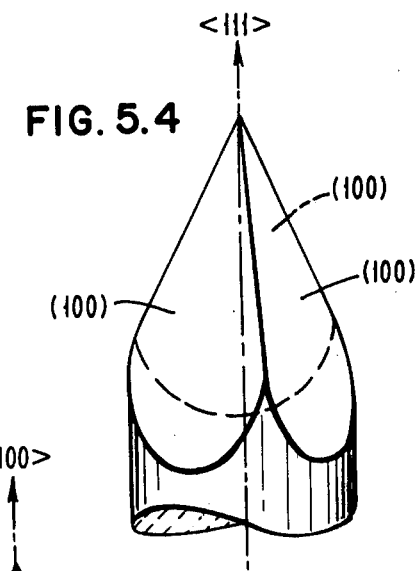
FIG. 5.4
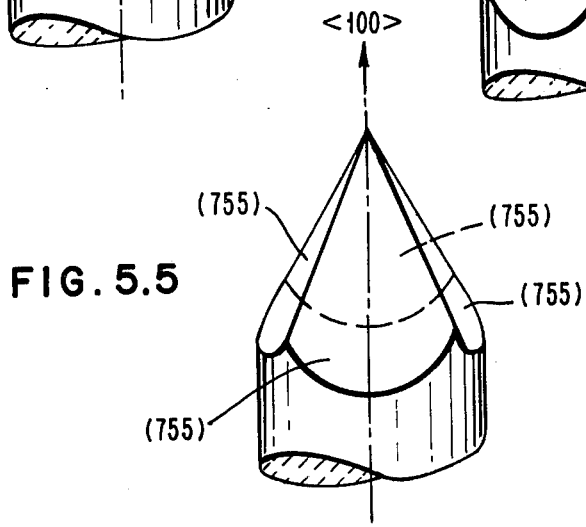
FIG. 5.5

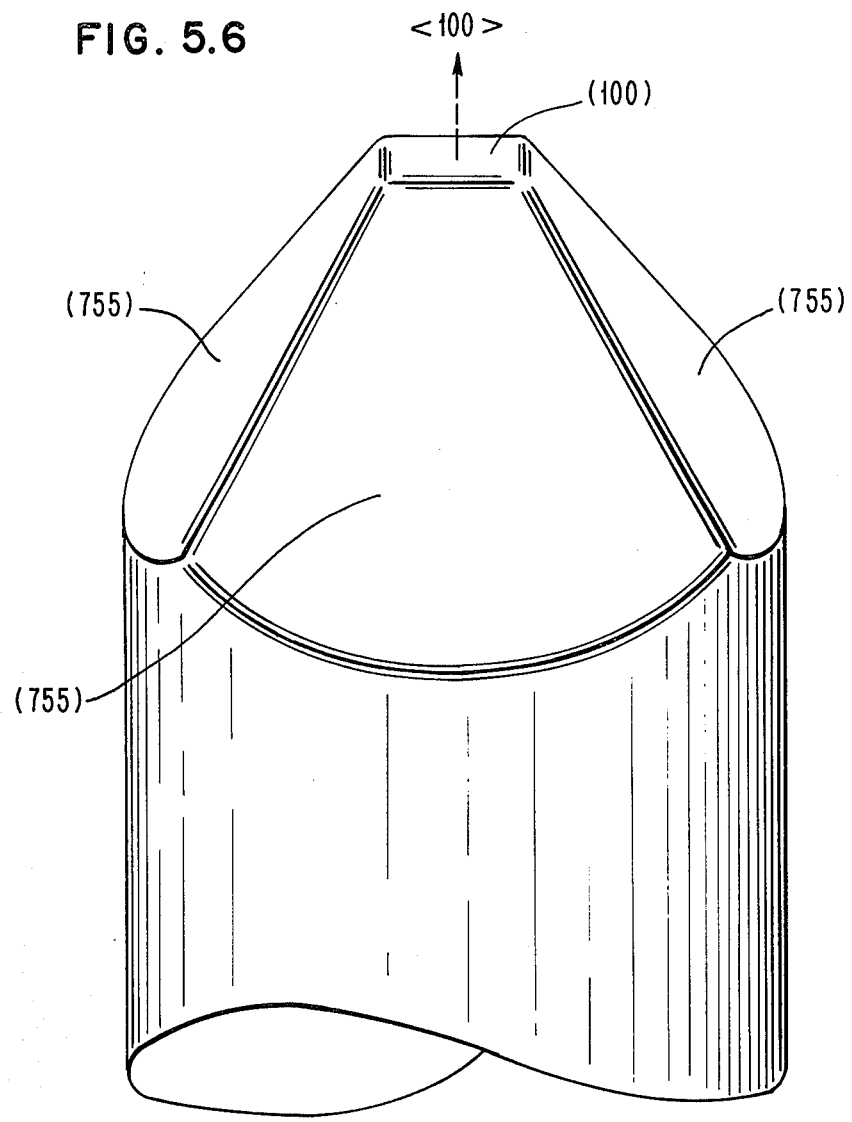
FIG. 5.6

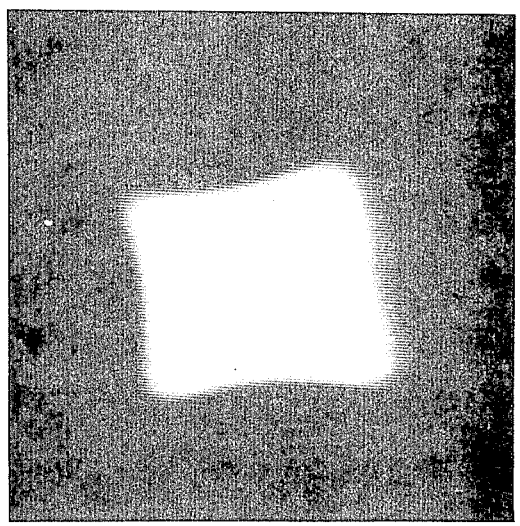
FIG. 11.1
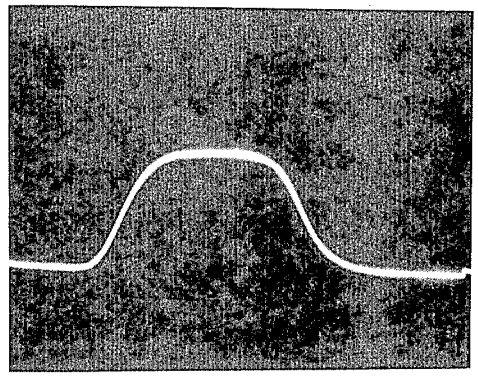
FIG. 11.2

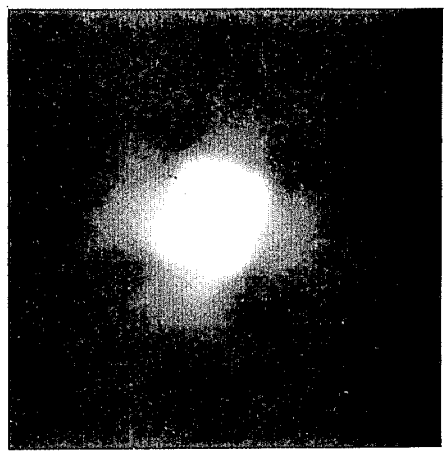
|←—— ——→|
4 mrad
FIG. 12.1
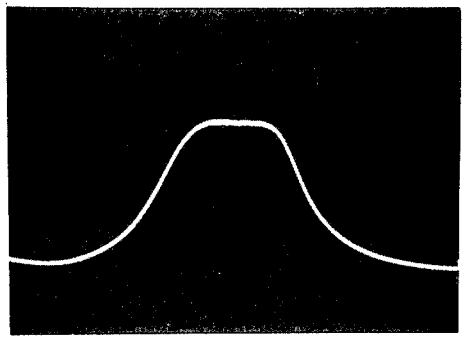
FIG. 12.2

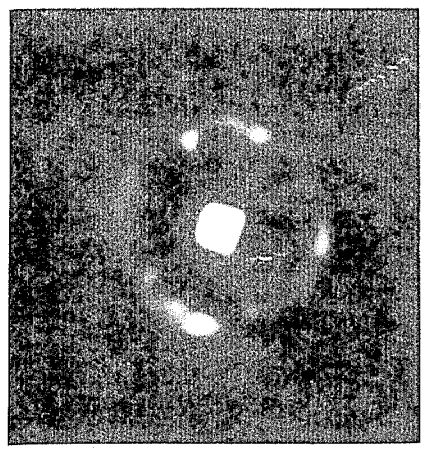
FIG. 13.1
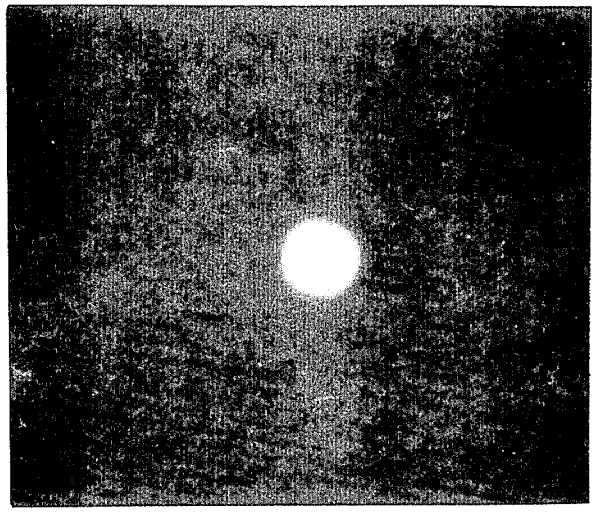
FIG. 13.2
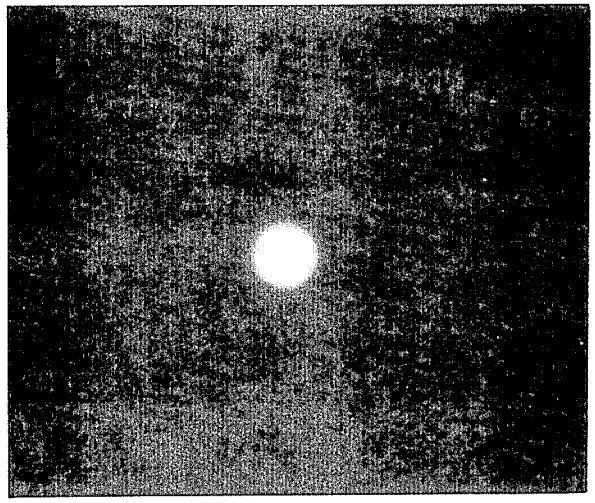
FIG. 13.3

SHAPED ELECTRON EMISSION FROM SINGLE CRYSTAL LANTHANUM HEXABORIDE WITH INTENSITY DISTRIBUTION

DESCRIPTION

1. Technical Field

This invention relates generally to electron beam emitting materials, and more particularly it relates to single crystal lanthanum hexaboride electron beam emitters.

2. Background Art

Modern electron beam systems such as electron beam microelectronic fabrication tools require a highly reliable, long life and stable electron beam which is shaped and bright and which has a uniform intensity distribution.

Normally a beam is desired with a square cross-section which is as uniform as possible over the desired square shaped area and which falls in intensity as quickly as possible outside of that area. The intensity of the shaped beam should fall as quickly as possible outside of the defined shape (usually square) because the beam is stepped from discrete position to discrete position to write a desired pattern on an electron beam sensitive surface. If the intensity does not fall quickly enough outside of the defined shape, regions in a pattern where no electron beam exposure is desired will become too much exposed as a result. Inside the shaped region the intensity should be as uniform as possible so that regions in the pattern which are to become exposed become exposed uniformly.

Shaped electron beams of this type are typically formed by generating an electron beam and shaping it by passing the beam through a shaped aperture (e.g., a square aperture). Shaped beam systems are described for example in Pfeiffer, "New Imaging and Deflection Concept for Probe-Forming Microfabrication Systems", 12 J. Vac. Sci. Technol. 1170–1173 (Nov./ Dec. 1975) and in Broers, "A Review of Electron Beam Lithography Techniques", Proceedings of 7th International Conference on Microlithography, Paris, France, pgs. 21–29 (1977), both of which are hereby incorporated by reference.

The conventional material used as a thermionic electron emission cathode for producing a shaped beam is tungsten. Lanthanum hexaboride ($LaB_6$) has been used to produce an unshaped or round beam because it has a lower work function, higher melting temperature, and lower vapor pressure than tungsten. Thus, $LaB_6$ cathodes promise higher brightness at the same operating temperature and pressure, and longer life.

$LaB_6$ has not been used to produce a shaped beam beacuse the beams produced by $LaB_6$ cathodes heretofore have always been characterized by a rather narrow angular distribution which is gaussian in shape. As a result, when such a beam is shaped with an aperture, the resulting beam does not have a uniform intensity distribution unless it is so small in size that it is impractical for use in microelectronic fabrication tools.

A tungsten cathode, on the other hand, produces a very broad angular distribution and can generate an electron beam with very high total current. Although the tungsten produced beam is also gaussian, the angular distribution is so wide and the total beam so intense that a small center region of the angular distribution can be selected by a shaped aperture and the resulting beam has a nearly uniform intensity distribution.

U.S. Pat. No. 4,055,780 describes a thermionic electron emission cathode fabricated from a single crystal of lanthanum hexaboride as opposed to sintered lanthanum hexaboride material. Single crystal $LaB_6$ provides higher brightness than sintered $LaB_6$. Holders for $LaB_6$ cathodes are described in U.S. Pat. No. 3,462,635, U.K. Pat. GB No. 2,003,655A, and in Crawford, "Mounting Methods and Operating Characteristics for $LaB_6$ Cathodes", Proc. SEM Conf. I 19–30 (1979), which are hereby incorporated by reference.

U.S. Pat. No. 4,054,946 reports that $LaB_6$ crystal orientation affects electron emission current. The highest emission current was said to be obtained from single crystal $LaB_6$ oriented with its emitting face defined by a (110) crystal plane.

A detailed report of the emission behavior of single crystal $LaB_6$ as a function of crystallographic orientation may be found in Hohn et al., "The Emission Behavior and Brightness of Single Crystal $LaB_6$ Cathode Materials", and in Verhoeven et al., "Influences of Crystallography and Purity on Brightness of $LaB_6$ Cathodes", 47 Jour. Appl. Phys. 5105–06 (1976). Both of these reports conclude that the <100> orientation results in higher brightness than other orientations tested.

The work function of $LaB_6$ and more particularly the dependence of work function upon crystallographic orientation is reported in articles such as: Yamanchi et al., "Work Function of $LaB_6$", 29 Appl. Phys. Lett. 638–40 (1976); Storms et al., "A Study of Surface Stoichiometry and Thermionic Emission Using $LaB_6$", 50 Jour. Appl. Phys. 3691–98 (1979); Aono et al., "Direct Observation of $LaB_6$(001) Surface at High Temperatures by X-Ray and Ultraviolet Photoelectron Spectroscopy, Low-Energy Electron Diffraction, Auger Electron Spectroscopy, and Work-Function Measurements", 50 Jour. Appl. Phys. 4802–07 (1979); Oshima et al., "Low Work Function and Surface Structure of the $LaB_6$(210) Surface Studied by Angle-Resolved X-Ray Spectroscopy, Ultraviolet Spectroscopy, and Low Energy Electron Diffraction", 51 Jour. Appl. Phys. 997–1000 (1980); and Nishitani et al., "Surface Structures and Work Functions at the $LaB_6$(100), (110) and (111) Clean Surfaces", 93 Surface Science 535–49 (1980).

Prior art electron beam emission cathodes of lanthanum hexaboride have a rod shape with a pointed end. These rods have a round or a polygonal cross-section or a combination of the two, depending mostly upon the method of fabrication. The pointed end has a round cross-section of decreasing size (usually a geometrical cone) ending at the apex with a spherical tip having a radius of curvature as small as possible, usually in the range of about 1–10 $\mu$m. No suggestion can be found in the prior art that any other geometrical shape for the pointed end or tip might improve performance in any way or cause the emitted beam to have a more uniform intensity distribution in particular.

DISCLOSURE OF INVENTION

I have discovered that an electron beam having a controlled shape can be directly emitted from an $LaB_6$ single crystal cathode by shaping the cathode tip itself. The $LaB_6$ cathode is provided with a flat top surface which is substantially perpendicular to the emitted beam direction and which corresponds in shape to the shape of the beam desired. For a square beam the flat top surface is square in shape. The size of the shaped top surface and operating conditions are arranged such that emission of electrons occurs over substantially the entire shaped top surface with minimum emission from side regions of the tip adjacent to this shaped surface. In order to maximize emission from the shaped top surface, a crystallographic orientation is selected such that the shaped top surface exposes a relatively low work function crystal plane. Emission from side regions of the tip adjacent to the shaped high emission surface may be reduced by orienting such side regions very obliquely to the emitted beam axis. The side regions may also be flat surfaces, in which case emission from these flat side surfaces may be reduced by orienting the flat side surfaces such that they expose relatively high work function crystal planes.

I have defined as a relatively low work function crystal plane those crystal planes having a lower work function than the average work function for sintered $LaB_6$. Relatively high work function crystal planes are defined as the other crystal planes. Relatively low work function crystal planes include the (100), (110), (111), (210), (321), and (311) crystal planes, but additional relatively low work function crystal planes which have not yet been tested probably exist. The (755) crystal plane is a relatively high work function crystal plane but many others clearly exist.

In order to obtain a square beam, my preferred tip geometry is a four side pyramid which has been truncated to form a top square surface. By orienting the crystal such that the top square surface corresponds with the (110) crystal plane, and by forming the pyramid side surfaces such that they correspond with (755) crystal planes, an $LaB_6$ single crystal has emitted a beam with a square shaped intensity distribution and a square shaped angular distribution rather than both distributions having gaussian shape.

While a shaped beam is emitted directly from the $LaB_6$ cathode, the intensity of the beam outside of the shaped region may not fall off as fast as desired. Thus, in accordance with one embodiment of this invention, the cathode shaped beam is further shaped by passing it through a similarly shaped, similarly sized, similarly oriented aperture, in order to reduce the intensity of electrons outside of the shaped region.

BRIEF DESCRIPTION OF THE DRAWINGS

FIG. 1.1 is a cross-sectional view of a <100> oriented $LaB_6$ rod formed by the floating zone method with heating by laser.

FIG. 1.2 is a cross-sectional view of a <110> oriented $LaB_6$ rod formed by the floating zone method with heating by laser.

FIG. 1.3 is a cross-sectional view of a <111> oriented $LaB_6$ rod formed by the floating zone method with heating by laser.

FIG. 2.1 schematically illustrates an electron gun test apparatus used in the described experiments.

FIG. 2.2 is an inverted and enlarged cross-sectional view of the electron gun shown in FIG. 2.1.

FIG. 4.1 is a partly broken away side view at another crystal grinding apparatus used to form facets on $LaB_6$ single crystal rod cathodes.

FIG. 4.2 is a top view of the apparatus of FIG. 4.1.

FIG. 5.1 is a perspective view of the end portion of a <100> oriented single crystal $LaB_6$ rod cathode illustrating a cone shaped tip.

FIG. 5.2 is a perspective view of the end portion of a <100> oriented single crystal $LaB_6$ rod cathode illustrating a four side pyramidal shaped tip exposing four (110) crystal planes.

FIG. 5.3 is a perspective view of the end portion of a <110> oriented single crystal $LaB_6$ rod cathode illustrating a four side pyramid shaped tip exposing two (100) crystal planes and two (755) crystal planes.

FIG. 5.4 is a perspective view of the end portion of a <111> oriented single crystal $LaB_6$ rod cathode illustrating a three side pyramid shaped tip exposing three (100) crystal planes.

FIG. 5.5 is a perspective view of the end portion of a <100> oriented single crystal $LaB_6$ rod cathode illustrating a four side pyramid shaped tip exposing four (755) crystal planes.

FIG. 5.6 is a perspective view of the end portion of a single crystal $LaB_6$ rod cathode as shown in FIG. 5.5 except that the apex has been truncated to form a flat top surface exposing a (100) crystal plane.

FIG. 11.1 is a two-dimensional picture of the cross-over intensity distribution of an electron beam emitted from the cathode illustrated in FIG. 5.6 showing shaping of the beam intensity distribution.

FIG. 11.2 is an oscilloscope representative of the cross-over intensity distribution shown in FIG. 11.1 and taken across the center of the cross-over.

FIG. 12.1 is a two-dimensional picture of the angular emission distribution of an electron beam emitted from the same cathode illustrated in FIG. 5.6 showing shaping of the beam angular emission distribution.

FIG. 12.2 is an oscilloscope representation of the angular emission distribution shown in FIG. 12.1 and taken across the center of FIG. 12.1.

FIG. 13.1 is the two-dimensional picture shown in FIG. 11.1 except that magnification has been reduced and sensitivity increased.

FIG. 13.2 is a two-dimensional picture of the cross-over intensity distribution of an electron beam emitted from the same cathode illustrated in FIG. 5.6 except that electrons are being omitted from the side surfaces as well as the top surface because the operating temperature has been reduced.

FIG. 13.3 is a two-dimensional picture of the cross-over intensity distribution of an electron beam emitted from the same cathode illustrated in FIG. 5.6 except that electrons are not being emitted from the entire top surface because the wehnelt electrode has been made more negative so as to reduce the emission region.

DESCRIPTION OF THE PREFERRED EMBODIMENTS

Figure 3:
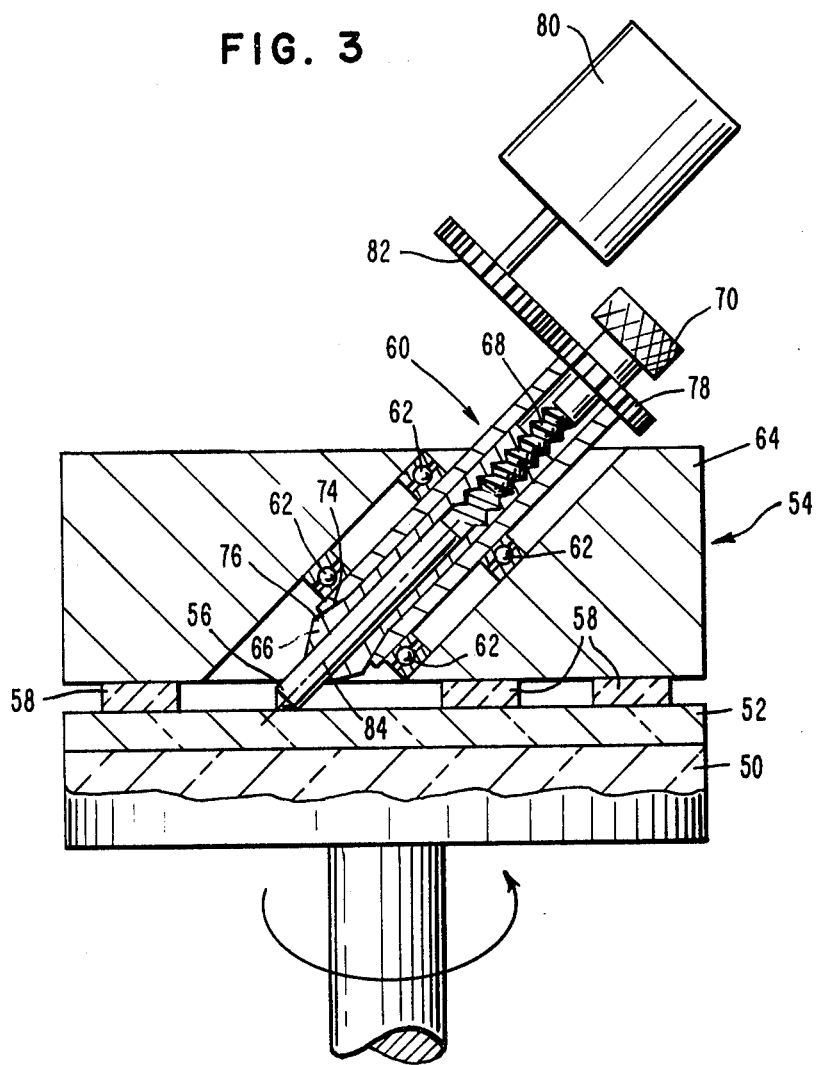
FIG. 3 is a cross-sectional view of crystal grinding apparatus used to form cone shaped and facetted tips on $LaB_6$ single crystal rod cathodes.

Single crystal $LaB_6$ suitable for practicing my invention may be formed by any method. At least four different methods are known. The induction heated floating zone method produces large grained polycrystalline $LaB_6$ from which single crystal samples can be cut or machined. Using multiflat zone geometry with this method, large high purity boules having essentially single crystal structure have been obtained. This method is described in more detail in Tanaka et al., "Growth of High Purity $LaB_6$ Single Crystals by Multi-Float Zone Passage", 30 J. Crystal Growth 193–197 (1975).

High yields of single crystal $LaB_6$ rods, plates, and cubes may be obtained using the metal flux method, in which an aluminum melt containing lanthanum and boron is slowly cooled through the liquidus. After solidification, the aluminum matrix is dissolved with HCl. This method is described in further detail in Futamoto et al., "Crystallographic Properties of $LaB_6$ Formed in Molten Aluminum", 14 Japan J. Appl. Phys. 1263–1266 (1975).

Larger size single crystal rods of $LaB_6$ may be grown by using the floating zone method with heating by an electric arc. Sintered feedstock is melted by an electric arc from a tungsten electrode. The resolidified $LaB_6$ is purified by the zone melting process and automatically becomes monocrystalline after the first few millimeters of growth. It may be seeded also to a desired crystallographic orientation. This method is described in detail in Verhoeven et al., "An Arc Floating Zone Technique for Preparing Single Crystal $LaB_6$", 36 J. Crystal Growth 115–120 (1976).

The crystal growth method I prefer and the one used to produce the $LaB_6$ single crystals for the experiments I describe is the floating zone method with heating by laser. This general method is described in U.S. Pat. No. 3,944,640 and application of this method to the growth of single crystal $LaB_6$ is described in particular detail in Takagi et al., "Growth of $LaB_6$ Single Crystals by a Laser Heated Floating Zone Method", 40 J. Crystal Growth 1–5 (1977) both of which are hereby incorporated by reference.

Briefly, the floating zone system employed to fabricate my crystals utilizes continuous wave laser radiation from a $CO_2$ laser (10.6μ wavelength) with a 500 W maximum output. The laser beam is split into two beams which are transmitted through KCL windows into a growth chamber. The two halves of the laser beam are focused to the same diameter (approximately 1.5 mm) at a point in space which defines the location of the molten zone. A single crystal seed and polycrystalline feed rod are attached to pulling shafts by chucks mounted on goniometers. Alignment of the seed to a specific crystallographic orientation is achieved by means of the Laue back-reflection method. The feed rod is positioned so that its axis is perfectly vertical and extends through the point defined by the intersection of the laser beams.

Feed rods of 2.16 mm diameter were cut from hot-pressed disks of $LaB_6$ obtained from the Haselden Corp. Prior to use, the feed rods were degreased and cleaned to remove any impurities introduced during machining. A piece of feed rod and an oriented $LaB_6$ seed are then mounted in holders and aligned, the growth chamber is sealed, evacuated to 20 torr and backfilled with argon to a slightly positive pressure to prevent oxidation of the $LaB_6$ during growth. Because $LaB_6$ poorly absorbs 10.6 μm radiation, the molten zone was partly surrounded with a gold plated spherical radiation shield to reflect laser and emitted blackbody radiation back into the molten zone.

Growth is initiated by lowering the tip of the feed rod into the laser beam and forming a molten drop. The seed is then raised until it touches the drop, which wets the seed. The seed is pulled from the molten zone at a selected rate with the feed rod advancing into the zone to maintain a constant zone volume. The growth rate for most crystals was 2 in/hr (5.1 cm/hr). During growth, the feed rate of the polycrystalline feedstock was adjusted to account for a diameter attenuation ratio of 2:1 as well as vaporization losses. As the run progresses, $LaB_6$ gradually is deposited on the surface of the radiation shield, which continually decreases its reflectance. The resulting decrease in power to the melt zone is balanced by continually increasing the power of the incident laser beam so that the net power input is relatively constant.

The sintered $LaB_6$ billets received from the Haselden Corp. were found to be single phase by x-ray diffraction analysis and contained low levels of Ta, Ni, and Fe as measured by x-ray fluorescence. Metallographically polished samples revealed a random distribution of small, metallic inclusions 2 to 10 μm in size. Analysis by EDAX in an SEM indicated the particles to be primarily composed of Ta, with lower quantities of Fe, Ni, and Cr (comparable in composition to an 18–8 stainless steel).

Single crystal fibers corresponding to several orientations were grown. Because of natural faceting at the periphery, cross-sections through a fiber are not necessarily circular. Typical examples are shown in FIG. 1.1, 1.2, and 1.3, which illustrate the rod cross-sections for $<100>$, $<110>$, and $<111>$ oriented rods respectively.

In order to test the performance of $LaB_6$ rod cathodes, a test system was set up to measure brightness, cathode temperature, cross-over intensity distribution and angular emission distribution. FIG. 2.1 schematically illustrates an electron gun test apparatus used in my experiments. A lanthanum hexaboride rod cathode 10 positioned behind a wehnelt electrode 12 emits an electrode beam 14 along axis 16 of a one lens magnifying electron optical column. The column includes an anode 18 positioned in the vicinity of the electron beam cross-over 10. The cross-over is magnified 7.7 times by lens 22 into the plane of a 5 μm diameter pin-hole aperture 24. A Faraday cup or a scintillator device 26 is positioned behind the pin-hole aperture to collect electrons passing through the pin-hole aperture. Deflection coils 28 scan the focused electron beam over the pin-hole aperture so that the intensity distribution of the cross-over can be obtained. The signal detected by device 26 is amplified by device 30 and imaged onto a CRT screen 32. The angular emission is obtained instead by scanning the whole emitted beam across the in-lens aperture 34 using deflection coils 36.

The pin-hole aperture 24 and detector 26, amplifier 30, and CRT 32 are also used to measure brightness by the following relationship:

$$\text{Brightness} = (I_c / A\pi\alpha^2)$$

where $I_c$ (ampere) is the current collected through the pin-hole aperture 24. A ($cm^2$) is the area of the pin-hole aperture, and $\alpha$ (radian) is the beam semiconvergent angle as defined by the in-lens aperture 34. In order to minimize errors that may be introduced by the lens aberrations, the beam defining aperture 34 is kept very small ($\alpha \sim 10^{-5}$ rad). With an in-lens aperture, the electron rays will still be influenced by the magnetic field after passing through the aperture. Thus an artifically enlarged aperture must be taken into account. Since the lens 22 is a weak lens of high focal length, however, the error introduced by the post aperture field is very small and has been corrected for in the graphs. Magnification in conjunction with a pin-hole aperture ensures that only the center portion of the intensity distribution is collected during the brightness measurement. This is important because the intensity distribution is generally Gaussian. A low magnification in conjunction with a large measuring aperture would result instead in incorrectly low brightness values.

FIG. 2.2 is an inverted and enlarged cross-sectional view of the electron gun showing electron beam cathode 10 supported by a collet type holder 38 and positioned close to wehnelt grid 12. Input leads 40 support and electrically drive tungsten wire heating coil 42. Heat shield 44 allows a lower input current for the same tip temperature. Because emission behavior is very dependent upon the temperature of the emitter, viewing port 46 in the wehnelt grid and gun housing allows the tip temperature to be accurately measured with an automatic pyrometer (not shown) during gun operation. All of my experiments were conducted using this gun arrangement.

The data for the graphs shown in FIGS. 6-10 was all collected using the one lens apparatus illustrated in FIG. 2.1. Pictures very similar to the pictures shown in FIGS. 11.1-13.3, but having lower resolution, were also observed using this apparatus. However, the actual pictures shown in FIGS. 11.1-13.1 were taken using the three lens electron beam column described in more detail by A. N. Broers in "Kohler Illumination and Brightness Measurements with Lanthanum Hexaboride Cathodes" 16 J. Vac. Sci. Technol. 1697 (1979), which is hereby incorporated by reference.

The cathodes used in my measurements were single crystal rods of about 20 mm diameter. The tip geometry was deliberately varied. Several crystallographic orientations were studied. For comparative purposes a sintered rod type $LaB_6$ cathode was also evaluated. Each cathode tip was prepared by using glass polishing techniques. Initially, a cone with 90° included angle was ground on the tip of each cathode (except those with a flat top) by axially rotating the cathode at an inclined angle of 45° with respect to a polishing disk.

The apparatus shown in FIG. 3 was used to form a cone shaped tip. A rotating table 50 supports a glass polishing disk 52. A disk type holder 54 supports the $LaB_6$ single crystal rod 56 to be ground. Replenishable pieces of glass 58 are attached to the bottom plane of the holder and are ground away at the same time that the $LaB_6$ rod is ground. As a result, the grinding process is very gradual which prevents mechanical damage to the cone surface. The crystal rod 56 is held by a chuck 60 which is rotatably supported by the holder base 64 via ball bearings 62. Jaws 66 of chuck 60 have inside threads which engage screw 68 having knob 70. When knob 70 is turned, jaws 66 move in the axial direction. Chuck collar 72 has an inside inclined surface 74 which engages an exterior inclined surface 76 of jaws 66 to force jaws 66 together as they are drawn toward knob 70. Collar 72 is mounted to a first gear 78, which is driven by motor 80 via second gear 82. Motor 82 thus rotates chuck 60 and also the crystal rod 56 held by chuck 60. Axis 84 of crystal rod 65 is inclined 45° with respect to grinding disk 52 so that a cone tip is formed on the end of rod 56 having an included angle of 90° (45° included angle between the cone side surface and the rod axis). Obviously mechanical modifications could be made which would allow variation in the angle of inclination and thus also in the cone included angle. A flat surface (facets) is formed merely by turning off or disengaging motor 80 for a period of time.

FIGS. 4.1 and 4.2 illustrate another method for grinding facets on the tip of an $LaB_6$ single crystal rod. A different holder is used in this case. Two pieces of glass 90 having a thickness equal to the diameter of the crystal rod 56 hold the rod between them in one dimension while these pieces 90 as well as the crystal rod are held in an orthogonal direction between two additional pieces of glass 92. All of this structure is temporarily bonded together using bees wax. Additional blocks 94 of glass are bonded to the sides of pieces 92 to reduce the rate at which grinding occurs. A second pair of blocks 96 are provided along the opposite edge for grinding a second opposing facet. Edges 98 are sufficiently flat such that the holder rests with stability on grinding disk 52 and are inclined with respect to the rod axis 100 at a desired angle. After each two facets are ground, the assembly is unbonded, the crystal is rotated and the structure is reassembled and bonded again to form another two facets. This is a very time consuming method and was used only to form experimental facets at oblique angles to the crystal axis other than 45°. Similar apparatus was used to form a flat surface on the top of a rod perpendicular to the axis of the rod prior to forming side facets. The configuration and shapes of the glass pieces were altered appropriately such that the crystal rod is vertically oriented with respect to disk 52. It should be noted that the position of the holder is such that polishing occurs in a direction towards the apex of the crystal tip. This directon was also used with the apparatus of FIG. 3 and results in sharper tips (lower radius of curvature) and less mechanical damage.

Throughout this application a specificallly oriented rod such as a <100> oriented rod will mean that the rod axis is aligned with or parallel to a <100> crystallographic axis. A specific crystal axis, such as a <100> crystal axis, by definition is perpendicular or normal to that crystal plane, a (100) crystal plane in this example. Cathodes were prepared from rods having six different crystallographic orientations, namely <100>, <110>, <111>, <321>, <210>, and <311> orientations.

Some cathodes were tested with a ground cone shaped tip. Others were further modified by facetting the cone tips prior to testing. Still others were given a flat top surface prior to facetting and facetting was done such that a flat top surface remained after facetting for testing. All of the tip shaping was done by grinding. The cathode must be rotationally positioned properly for each flat surface or facet. Axial orientation of the crystal was determined by reference to the natural structure which forms along the side surface of a grown fiber itself. For example, as shown in FIG. 1.1, a <100> oriented fiber develops natural flat side surfaces aligned with the (100) crystal planes. The orientation of these naturally formed flat surfaces was verified by x-ray diffraction. FIG. 1.2 illustrates the two flat surfaces which naturally form along the (100) crystal planes when a <110> oriented fiber is formed by the floating zone method with laser heating. FIG. 1.3 shows the three longitudinal ridges which form when a <111> oriented LaB$_6$ fiber is formed by this method. X-ray diffraction confirms that the ridges correspond in axial position with the <211> directions.

Using the apparatus shown in FIG. 3, the cathodes illlustrated in FIGS. 51.-5.5 were prepared. The tip illustrated in FIG. 5.4 was initially formed into a cone shape using the FIG. 3 apparatus and then facetted using the apparatus shown in FIGS. 4.1-4.2. All of the pyramidal shapes except the ones with a flat top surface were formed first by making a cone shaped tip and then facetting the cone shaped tip. The radius of curvature of the apex of all of these pointed tips was 2-3 μm. The flat top surface cathodes had a flat top surface with dimensions of about 5-20 μm.

FIG. 5.1 illustrates a <100> oriented cone shaped tip with the axis of the cone oriented in the <100> direction, which coincides with the rod axis.

FIG. 5.2 shows a pyramidal tip ground on the end of a <100> oriented rod. The axis of the pyramid (the direction in which the pyramid points) is oriented in the <100> direction which coincides with the rod axis. The crystal was oriented so that each of the four sides of the pyramidal tip coincides with and exposes a (110) crystal plane. For ease of illustration and in order to emphasize the importance only of the tip geometry, the cross-section of the rod is shown as circular. Any convenient rod cross-section could be used instead. It should be understood that in reality the cross-section of my <100> oriented rods was as shown in FIG. 1.1.

FIG. 5.3 again illustrates a pyramidal tip ground this time on the end of a <110> oriented rod. The axis of the pyramid (direction in which it points) is oriented in the <110> direction, which again coincides with the rod axis. The crystal was oriented so that two of the four sides of the pyramidal tip coincide with and expose (100) crystal planes. The two other sides of the pyramidal tip coincide with and expose (755) crystal planes. For ease of illustration again and in order to emphasize the importance only of the tip geometry, the cross-section of the rod is shown as circular. Any convenient rod cross-section could be used instead. It should be understood that in reality the cross-section of my <110> oriented rods was as shown in FIG. 1.2.

FIG. 5.4 also shows a pyramidal tip ground this time on the end of a <111> oriented rod. This pyramidal tip has three rather than four sides. The axis of the pyramid is oriented in the <111> direction, which also coincides with the rod axis. The crystal was oriented such that each of the three sides of the pyramidal tip coincides with and exposes a (100) crystal plane. For ease of illustration again and in order to emphasize the importance only of the tip geometry, the cross-section of the rod is shown as circular. Any convenient rod cross-section could be used instead. It should be understood that in reality the cross-section of my <111> oriented rods was as shown in FIG. 1.3. In all of the previously described pyramidal tip configurations, the included angle between a pyramid side and the pyramid axis is 45°, which corresponds exactly with the included angle between the side and the axis of the cone shaped configurations also tested. In the example shown in FIG. 2.4, however, the included angle is only about 35.7°. This included angle results when (100) crystal planes are exposed on a <111> oriented rod. In this case the rod is inclined aout 35.7° during facet grinding rather than 45°.

FIG. 5.5 illustrates a different pyramidal tip ground on the end of a <100> oriented rod. The axis of this pyramid is still oriented in the <100> direction, which coincides with the rod axis. However, this time the crystal was axially oriented such that each of the four flat sides of the pyramidal tip coincides with and exposes a (755) crystal plane. The included angle between a side of this pyramidal tip and the pyramid axis is also 45°.

FIG. 5.6 illustrates the same pyramidal tip as shown in FIG. 5.5, except that the pyramid has been truncated with a flat top surface which coincides with and exposes a (100) crystal plane.

Figure 6:
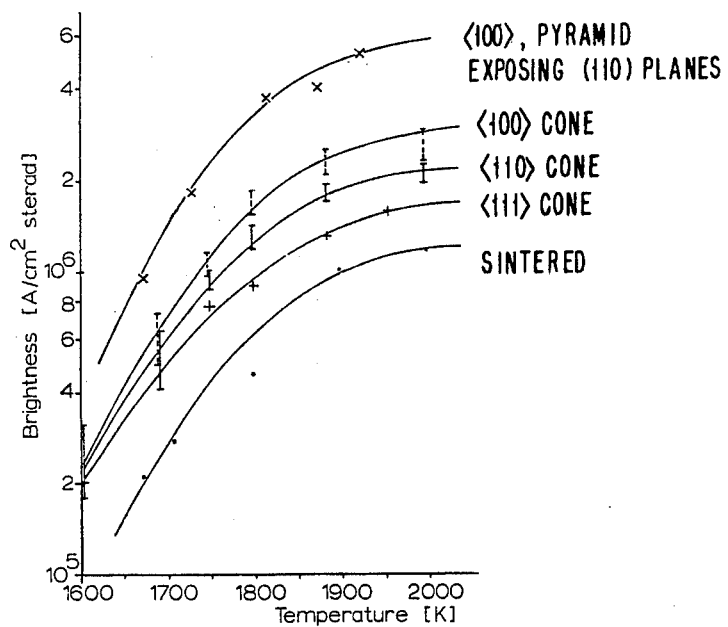
FIGS. 6–10 are graphs comparing the measured brightnesses of electron beams emitted from each of the $LaB_6$ cathodes illustrated in FIGS. 5.1–5.5 and from $LaB_6$ cathodes having a cone shaped tip but crystallographic orientations other than illustrated in FIG. 5.1.

FIG. 6 is a graph comparing measured brightness as a function of temperature for the <100> rod cathode and for two other single crystal LaB$_6$ rod cathodes having a similar cone shaped tip but different orientations. A spread in measured values for different samples of the same type is indicated by vertically extended measurement ranges rather than discrete points. This graph also compares these measured brightnesses on the one hand with a cathode rod of sintered LaB$_6$ material having a similar cone shaped tip and on the other hand with the <100> oriented LaB$_6$ cathode rod with a pyramidal tip illustrated in FIG. 5.2. All of these brightnesses were measured for a 20 kV electron beam at 200 μA. As shown, the lowest brightness is for a sintered rod. The single crystal cathode rods having a cone shaped tip are significantly brighter than the sintered rod, the <100> oriented rod representing about a three-fold improvement in brightness, followed with less improvement in brightness by the <100> oriented rod and then the <111> oriented rod. The single crystal cathode rod having a pyramidal tip, however, has the highest brightness of all. The <100> oriented pyramidal tip has about a three-fold higher brightness than the same <100> oriented cone shaped tip. Since both of these tips had a similar apex, namely a spherically shaped apex of 2-3 μm radius, the improvement in brightness is attributed to the flat side surfaces or facets. These results have turned out to be repeatable and have been verified by and better understood through detailed study of cross-over intensity distributions and angular emission distributions using the test apparatus illustrated in FIGS. 2.1 and 2.2.

Figure 7:
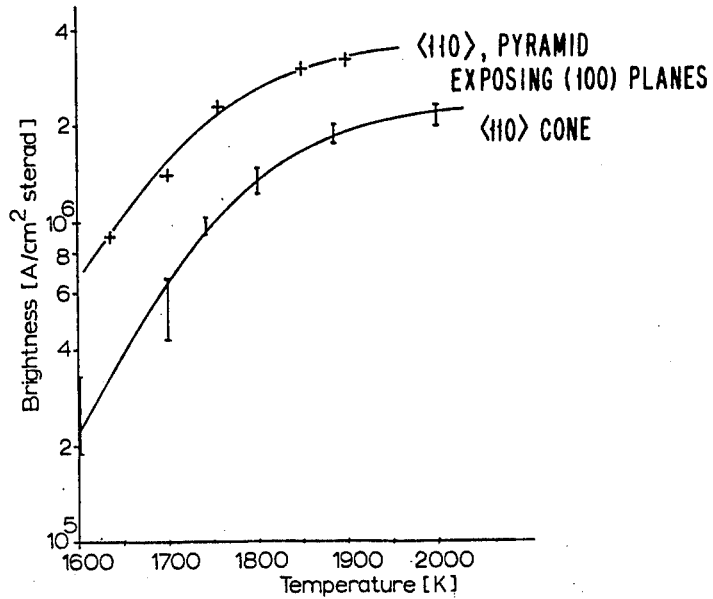

FIG. 7 is a graph comparing measured brightness as a function of temperature for a <110> oriented single crystal LaB$_6$ rod cathode having a cone shaped tip with the similarly oriented single crystal LaB$_6$ rod having a pyramidal tip illustrated in FIG. 5.3. Vertically extended measurement ranges are shown again with the <110> oriented cone tip curve. The single crystal cathode having the pyramidal tip has a brightness about twice the brightness of the same <110> oriented rod having a cone shaped tip. All of these brightnesses were measured at 20 kV and 200 μA. Since both of these tips had a similar apex, namely spherical with a 2-3 μm radius, the improvement in brightness is attributed to the flat side surfaces or facets.

The cross-over intensity distribution and the angular emission distribution of the pyramidal tips can and have been studied in detail because the beam contributions from each of the individual facets can be individually studied, particularly at lower operating temperatures. It was noted in the case of the <110> oriented pyramidal tip illustrated in FIG. 5.3 that relatively large beam contributions occurred from the (100) facets and relatively small beam contributions occurred from the (755)

facets. I have attributed this to the relatively low work function of a (100) crystal plane and the relatively high work function of a (755) crystal plane. It is apparent to me from these studies that the tip shown in FIG. 5.3 would have had no lower brightness if the (755) facets had not been formed (i.e., if these regions of the tip had remained conical in shape). In fact, my observations lead me to believe that this partly facetted and partly conical configuration would have higher brightness than the fully facetted configuration illustrated in FIG. 5.3.

Figure 8:
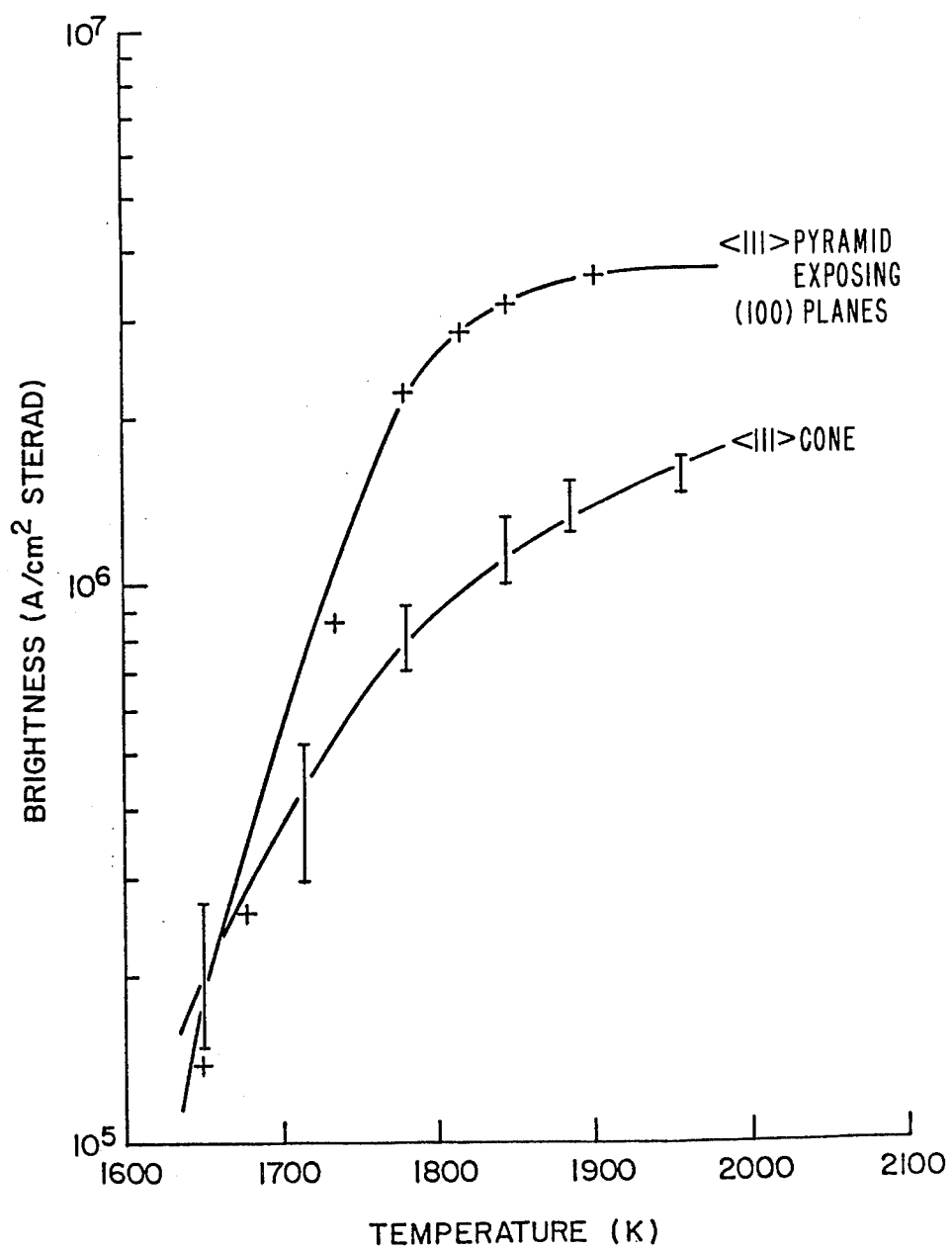

FIG. 8 is a graph comparing measured brightness as a function of temperature for a <111> oriented single crystal $LaB_6$ rod cathode having a cone shaped tip with the similarly oriented single crystal $LaB_6$ rod having a pyramidal tip illustrated in FIG. 5.4. Vertically extended measurement ranges are shown here with the <111> oriented pyramidal tip to illustrate the degree of repeatability. All of the brightnesses were again measured at 20 kV and 200 µA. Since both of these tips again had a similar apex, namely spherical with a 2-3 µm radius, the 2-3 fold improvement in brightness for the pyramidal tip configuration is attributed to the flat side surfaces or facets.

Figure 9:
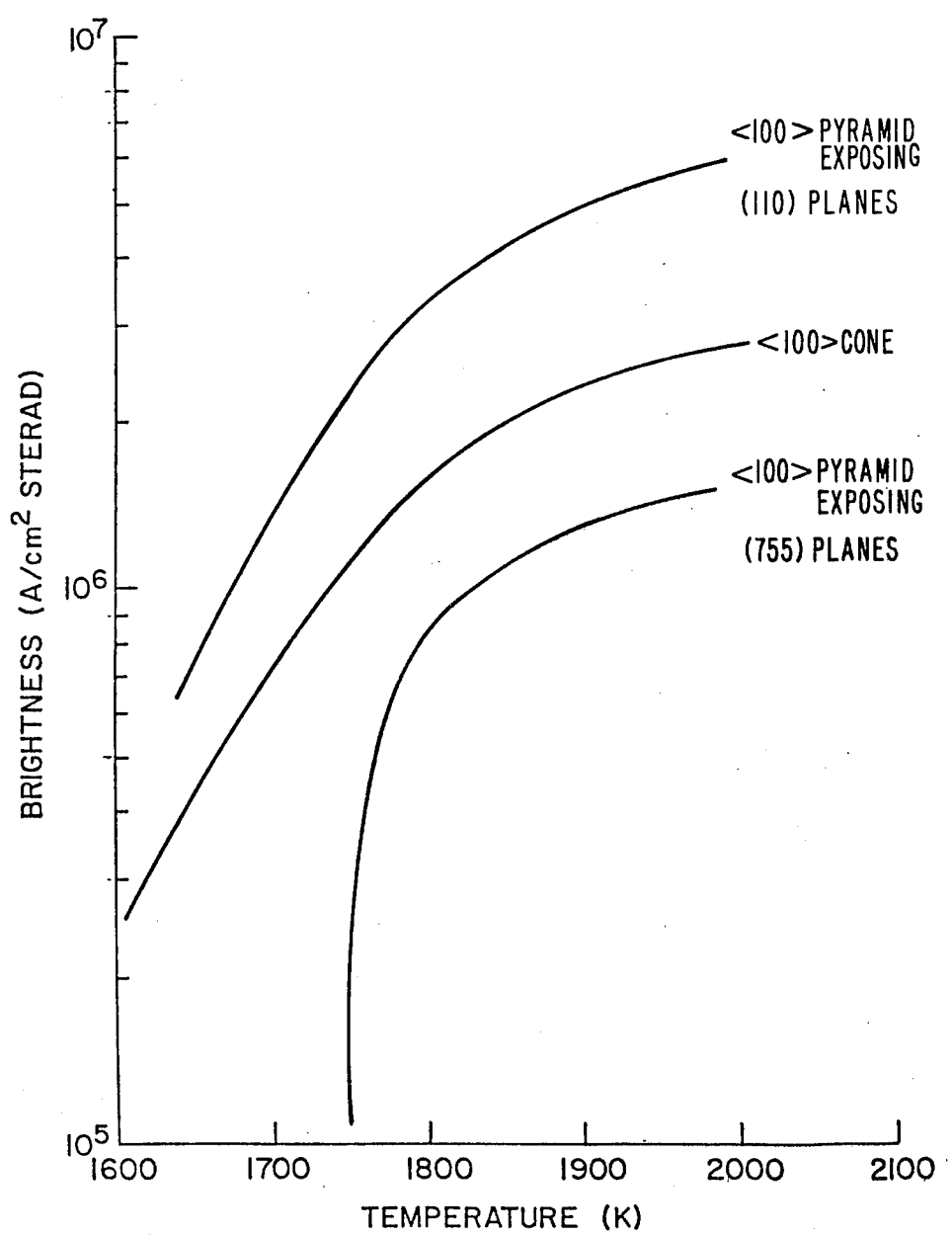

It should be observed that the pyramidal tips illustrated in FIGS. 5.2–5.4 expose (100) and (110) crystal planes, which are known to be two of the lowest work function crystal planes for $LaB_6$. In order to dramatically illustrate the dependence of brightness on the particular selection of crystal planes exposed, a crystal tip was deliberately prepared which exposes only $LaB_6$ crystal planes which have a relatively high work functon, namely (755) crystal planes. These planes were selected because the included angle between the exposed faces and the pyramid axis is 45° and because this pyramid also has four sides. This tip geometry is illustrated in FIG. 5.5. Since brightness was measured again at 20 kV and 200 µA, a direct comparison can be made with previously described results. FIG. 9 is a graph comparing measured brightness as a function of temperature for the tips illustrated in FIGS. 5.1, 5.2, and 5.5. Since these cathodes all had a similar apex, namely spherical with a 2-3 µm radius, the same <100> orientation, the same number of facets, the same included angle for the facets, and the same operating conditions, the low measured brightness for the tip exposing only (755) crystal planes in comparison with the tip exposing only (100) crystal planes is attributed to the selection of relatively high work function crystal planes for exposure in the one sample and the relatively low work function crystal planes for exposure in the other sample. It should be noted that a cone tip exposes a continuum of crystal planes around the cone surface. Since the cone shaped tip exposes a mixture of both relatively low and relatively high work function planes, it would be expected that the brightness for the cone shape represents some kind of average. As illustrated in FIG. 9, the measured brightness for the cone shaped configuration does indeed fall between the other two.

Figure 10:
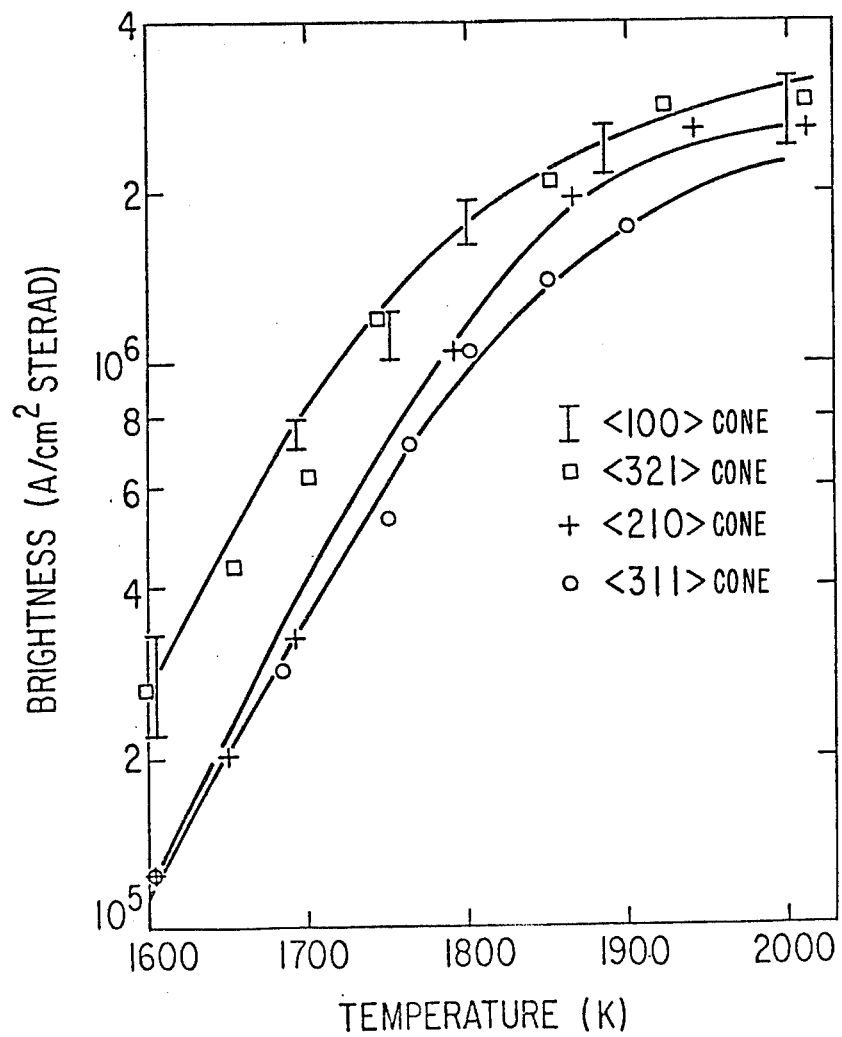
Figure 14:
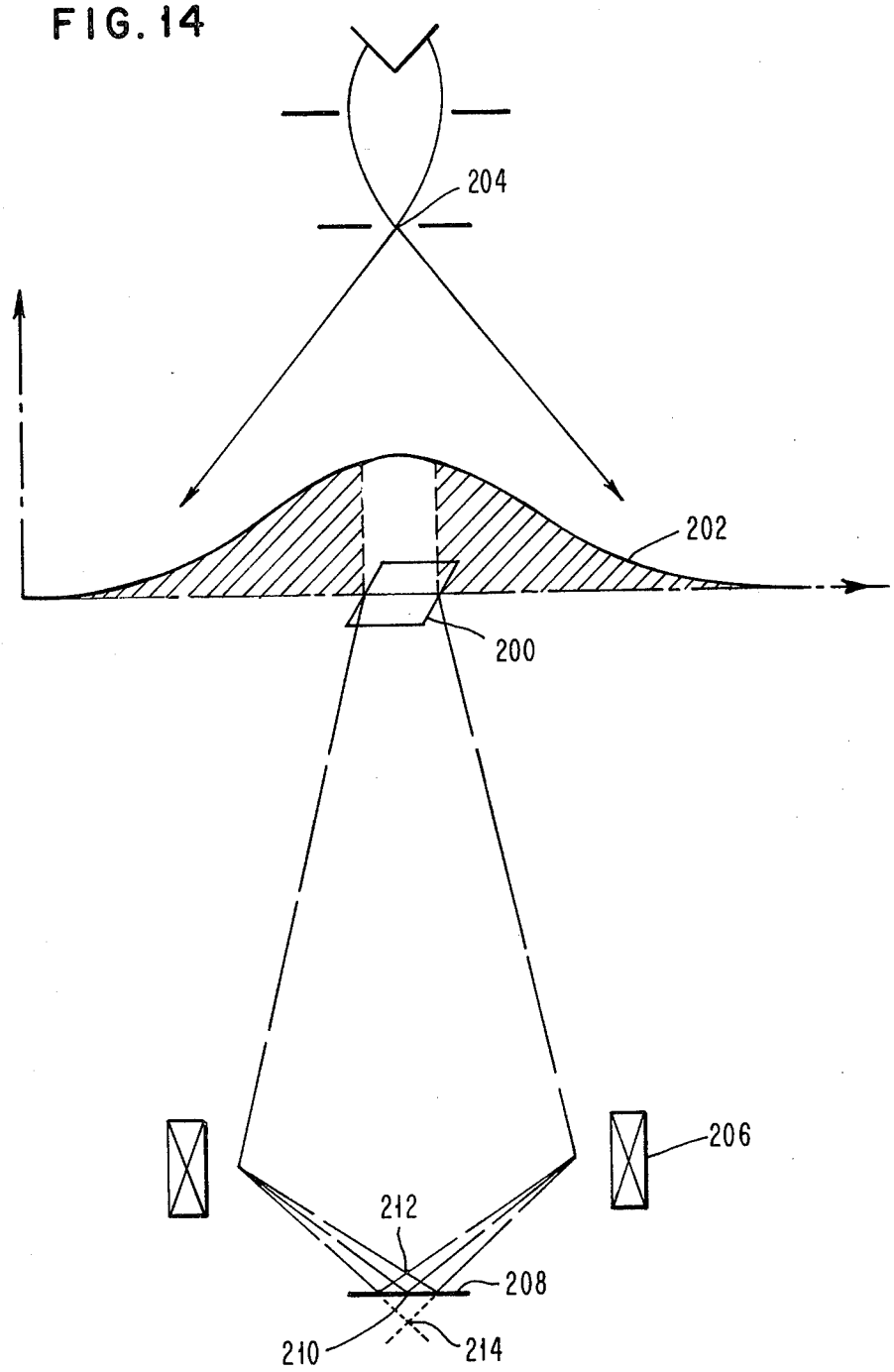
FIG. 14 illustrates a conventional shaped electron beam system using a tungsten cathode and graphically shows the intensity distribution at the shaping aperture.

FIG. 10 is a graph comparing measured brightness as a function of temperature for single crystal cathodes having cone shaped tips and various crystal orientations, including <100>, <321>, <210>, and <311> orientations. The <100> and <321> orientations produce approximately the same brightness curve while the brightness for the <210> and <311> orientations is somewhat lower though still better at moderate or high temperatures than a sintered cathode having a cone tip. These curves and the cone shaped tip curves in FIG. 6 may be directly compared since they all correspond to identical tip geometry and operating conditions. The axis of the electron beam is always coincident with the axis of the cone tip and the cathodes were all operated at 20 kV and 200 µA. Since the only difference is in the crystal orientation, it is apparent that apart from tip geometry, the orientation of the crystal with respect to the axis of the electron beam also has a significant effect upon brightness. The crystal orientations which result in relatively high brightness are the orientations which have a low work function crystal plane perpendicular to the electron beam axis. Since all of the single crystal cone shaped tip curves have higher brightness than the sintered cone shaped tip curve, it is apparent that the work functions of the associated individual crystal planes are all lower than the average work function for all $LaB_6$ crystal planes (represented by sintered material). Thus, among the crystal planes which can be considered as having a relatively low work function (lower than the average work function for sintered $LaB_6$) are the (100), (110), (111), (321), (210), and (311) crystal planes. I except that additional $LaB_6$ crystal planes will also be considered as having relatively low work function when it is established that they have a lower work function than the average work function for sintered $LaB_6$.

In order to get high brightness, the effective average of the work functions around the tip was reduced, in effect, by maximizing the amount of emitting tip area having a relatively low work function and minimizing the amount of emitting tip area having a relatively high work function. This was done by selecting crystal planes having relatively low work functions and maximizing the tip area exposing such crystal planes by forming flat surfaces or facets corresponding to such crystal planes.

In view of the importance of crystallographic orientation with respect to the electron beam axis, as well, it might seem that a large area flat surface corresponding to the lowest work function plane and oriented perpendicular to the electron beam direction would produce the highest possible brightness. This has not been verified. My experiments with this geometry only resulted in destroying the wehnelt electrode. In an attempt to avoid destruction of the wehnelt electrode, I reduced the area of the flat top surface and surprisingly discovered that the geometry of the apex surface affects the shape of the emitted beam. More significantly, the intensity distribution curve may be flattened by flattening the top surface and the beam may be shaped by controlling the shape of the flat top surface.

FIG. 11.1 is a two-dimensional picture of the cross-over intensity distribution of an electron beam emitted from the cathode illustrated in FIG. 5.6. It illustrates shaping of the beam intensity distribution since the beam is square shaped and the top (100) facet of the tip is square shaped. It should be noted that the gain has been raised in this photograph so that the less intense fringe areas of the beam would be visible. These areas are indicated by the hatched region. The solid center area represents the intense part of the beam and is square shaped.

FIG. 11.2 is an oscilloscope representation of the cross-over intensity distribution shown in FIG. 11.1 and taken across the center of the pictured beam. It illustrates the flatness or uniformity of the intensity within the square shaped beam.

FIG. 12.1 is a two-dimensional picture of the angular emission distribution of the same electron beam shown in FIG. 11.1. It shows that the angular emission distribution of the electron beam is also shaped, i.e., square.

FIG. 12.2 is an oscilloscope representation of the angular emission distribution shown in FIG. 12.1 taken across the center. It shows the flatness or uniformity of the angular distribution within the square shaped beam.

FIGS. 13.1, 13.2 and 13.3 illustrate what happens when operating conditions are such that electron emission is from an area of the tip which is too large or too small. FIG. 13.1 is the same as FIG. 11.1 except for a change in magnification and sensitivity. In FIG. 13.2 the temperature of the cathode was reduced so that emission occurs from a large area of the tip. The shaping of the intensity distribution disappeared when the temperature was lowered. In FIG. 13.3 the wehnelt electrode was made more negative so that electrons are emitted from a smaller region. Again, the shaping of the intensity distribution disappeared.

I conclude from this that the operating conditions should be such that emission occurs as well as possible from the entire shaped top surface and from only this surface.

EXPERIMENT I

In this experiment the size of the top flat surface shown in FIG. 5.6 was both increased and reduced. The results illustrated in FIGS. 11.1-13.3 were obtained with a square top surface having 15 μm sides. When the size of the square top was changed to 7.5 μm and 5 μm, the size of the square shaped beam was reduced accordingly. When the size of the square top was increased so that it had 20 μm sides, the size of the square shaped beam was increased. I conclude that the size of the shaped flat top surface controls the size of the shaped beam.

EXPERIMENT II

In order to demonstrate the effect, if any, of the shape of the wehnelt hole on the shape of the electron beam, I constructed a square shaped wehnelt hole and aligned it in orientation with the square shaped top flat surface of the cathode. The shaped wehnelt produced no apparent effect.

EXPERIMENT III

In order to test other shaped top facets, I formed a round top facet on the end of a cone shaped tip. The round top facet was 10 μm in diameter and the crystal had a <100> orientation as did all the previously described flat top cathodes. A round beam was formed, but with a flat or uniform intensity distribution. With a spherical tip, the beam still has a circular intensity distribution, but the intensity distribution is gaussian rather than uniform in the center (flat) with a sudden decrease in intensity around the edge.

EXPERIMENT IV

In this experiment a rectangular top flat was constructed from a <110> oriented crystal. The tip shape was a truncated pyramid with the short sides of the rectangular top meeting side surfaces which expose (100) crystal planes and the long sides of the rectangular top meeting side surfaces which expose (755) crystal planes. The top surface exposed a (110) plane.

The shape of the beam was rectangular. It was noted, however, that the intensity was lower and at the short side the intensity dropped off less rapidly than at the long side of the rectangle. I attribute the lower intensity to the selection of the (110) plane for the top surface. The (110) plane has a higher work function than the (100) plane used for the top surface in the other cathodes. Consequently, lower intensity is not surprising. I attribute the difference in the steepness at which the intensity falls off also to the selection of planes to expose. The two sides of the pyramid which exposed (110) planes fell in intensity much less rapidly because (110) planes have a relatively low work function. The two sides of the pyramid which exposed (755) planes fell much faster in intensity because (755) planes have a relatively high work function. I conclude from this that the side surfaces adjacent the shaping top surface should have a relatively high work function or otherwise be caused to emit electrons less readily. My experiments have shown that sides which are steeper emit electrons less readily. Accordingly, I would expect that if the rate at which the intensity distribution falls off outside of the flat region is not sufficiently great, the sides could be made steeper.

FIG. 4 illustrates a conventional shaped electron beam system using a tungsten cathode. The graph curve 202 illustrates a typical gaussian intensity distribution at a square shaping aperture 200. Aperture 200 passes only a small portion of the total beam, but the shape of the beam passed by the aperture is square and has a substantially uniform intensity distribution. The portion of the beam not passed is represented by the hatched region under the graph curve.

Since the total beam current passing through the tungsten beam cross-over 204 is very large, Boersch interaction between electrons results in a spread in electron energies. The engery spread for a tungsten beam is about 8 electron volts. The following optics (such as lens 206) are sensitive to electron energies, so that at the target plane 208 there is a broadening of the beam, and presumably a slight reduction of the flatness of the intensity uniformity in a direction toward gaussian. Electrons having the correct energy arrive at a desired spot 210 on the target plane. Electrons which have slightly less energy (due to Boersch effect or the natural energy spread of the cathode material) are deflected more readily and become focussed at spot 212 above the target plane. Electrons which have slightly more energy are deflected less readily and become focussed at spot 214 below the target plane. This chromatic aberration results in a broadening of the size of the square beam.

Figure 15:
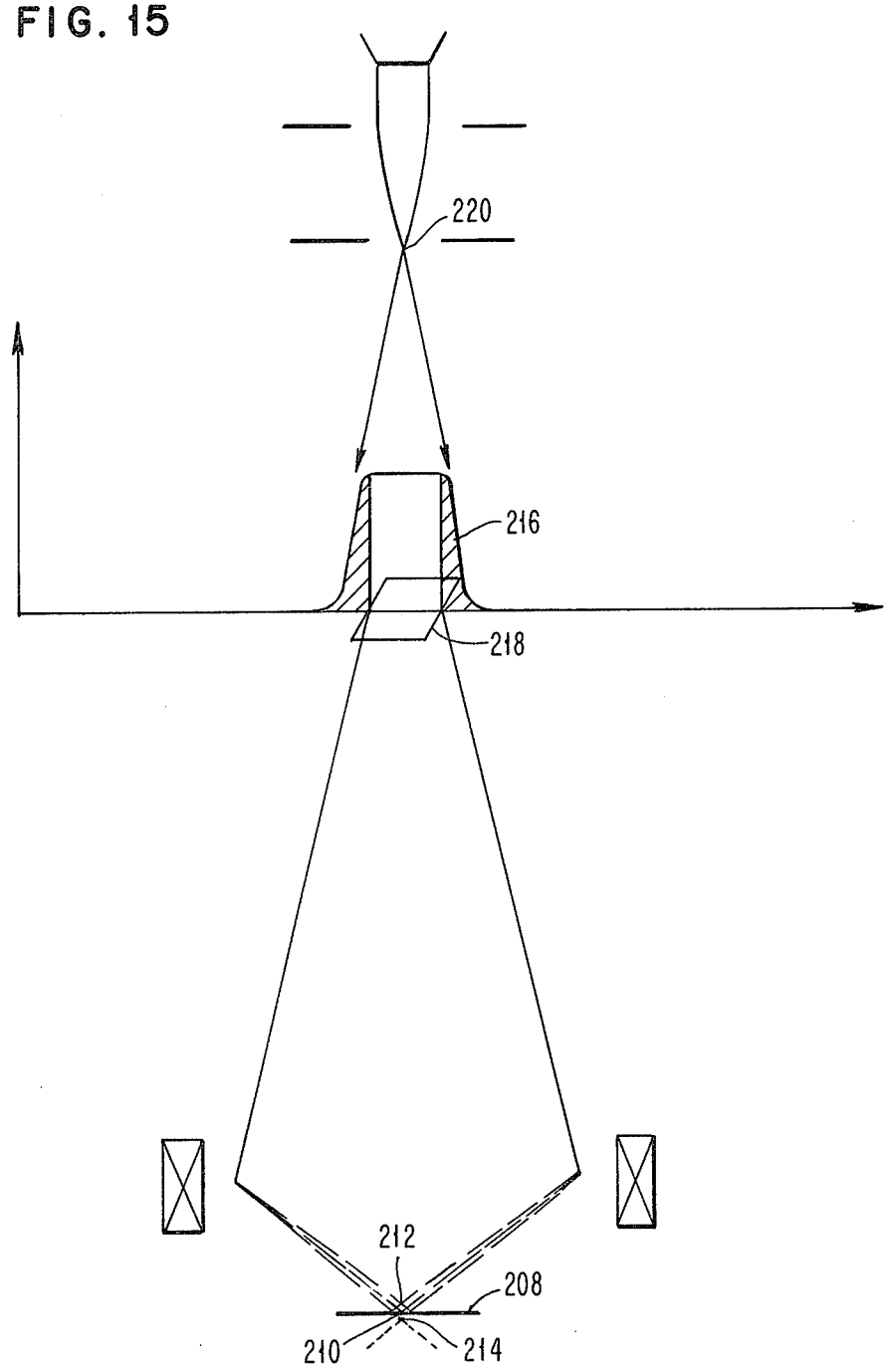
FIG. 15 illustrates a shaped electron beam system using a shaped $LaB_6$ single crystal cathode and graphically shows the intensity distribution at the shaping aperture.

FIG. 15 illustrates a similar shaped beam system using a shaped LaB$_6$ single crystal cathode. Curve 216 illustrates the intensity distribution of the square beam coming from the shaped LaB$_6$ cathode. Aperture 218 is also square shaped and corresponds in size and orientation to the incident shaped beam. The beam emerging from the aperture is still square shaped but now has an intensity distribution outside of the shaped region which fall off much more rapidly. At the target plane 208, the distance between spots 210, 212 and 214 is reduced to represent a reduction in chromatic aberration. Chromatic aberration is reduced because at the cross-over 220 of the LaB$_6$ produced beam, there is less electron density. This is apparent in the graph from the reduced shaded area under curve 216. LaB$_6$ also emits a beam with a lower energy spread to begin with because LaB$_6$ (particularly single crystal LaB$_6$) has a lower work function.

It should be apparent to those of ordinary skill in this art that many changes and modifications could be made without departing from the spirit and scope of my invention as defined in particular by the following claims. In my copending application entitled "Single Crystal Lanthanum Hexaboride Electron Beam Emitter Having High Brightness" and filed simultaneously herewith, I make additional claims.

Having thus described my invention, what I claim as new and desire to secure by Letters Patent is:

1. Apparatus for producing a shaped electron beam, comprising:

a lanthanum hexaboride single crystal for emitting an electron beam along a beam axis, characterized in that said lanthanum hexaboride single crystal has a flat emitting surface perpendicular to said beam axis, said electron beam being primarily emitted from said flat surface and from substantially the entire area of said flat surface, said flat emitting surface exposing a crystal plane having a work function equal to or less than the work function of the (111) crystal plane, said flat emitting surface having a shape corresponding with the desired shape of the emitted electron beam.

2. Apparatus as defined in claim 1 wherein said flat emitting surface has a non-circular shape.

3. Apparatus as defined in claim 2 wherein said flat emitting surface has a square shape.

4. Apparatus as defined in claim 1 wherein said flat emitting surface exposes a crystal plane selected from the group of crystal planes consisting of the (100), (110), (111), (321), (210), and (311) crystal planes.

5. Apparatus as defined in claim 1 wherein said flat emitting surface exposes a crystal plane selected from the group of crystal planes consisting of the (100), (110), (210), and (321) crystal planes.

6. Apparatus as defined in claim 1 wherein electron emission from the surface regions of the cathode adjacent to said flat emitting surface is suppressed.

7. Apparatus as defined in claim 6 wherein electron emission from surface regions of the cathode adjacent to said flat emitting surface is suppressed by orienting said adjacent surface regions oblique to said flat emitting surface.

8. Apparatus as defined in claim 7 wherein said adjacent surface regions are oriented at least 45 degrees from said flat emitting surface.

9. Apparatus as defined in claim 8 wherein said adjacent surface regions are primarily flat regions.

10. Apparatus as defined in claim 9 wherein said adjacent flat surface regions expose crystal planes having relatively high work functions.

11. Apparatus as defined in claim 10 wherein a relatively high work function is a work function more than the average work function for sintered lanthanum hexaboride.

12. Apparatus as defined in claim 1 wherein the emitting tip of said single crystal lanthanum hexaboride cathode has the shape of a truncated pyramid.

13. Apparatus as defined in claim 12 wherein said pyramid has four sides and a flat apex, said apex being the said flat emitting surface.

14. Apparatus as defined in claim 13 wherein said flat apex surface exposes a (100) crystal plane and the side surface of said pyramid expose (755) crystal planes.

15. Apparatus as defined in claim 1 and further characterized in that the emitted electron beam has a substantially uniform intensity distribution over the shaped region of said beam.

16. Apparatus as defined in claim 15 and further characterized in that the emitted electron beam has a substantially uniform angular distribution over the shaped region of said beam.

17. Apparatus as defined in claim 1 wherein said emitted electron beam has an intensity distribution which is non-gaussian.

18. Apparatus as defined in claim 1 wherein said emitted beam is further shaped by passing said beam through a shaped aperture.

19. Apparatus as defined in claim 18 wherein said shaped aperture has the same shape and about the same size as the shaped region of said emitted electron beam and is similarly oriented such that said shaped aperture tends to block electrons which are not within the shaped region of said beam.

20. Apparatus for producing a shaped electron beam, comprising:

a lanthanum hexaboride single crystal cathode for emitting an electron beam along a beam axis, characterized in that said lanthanum hexaboride single crystal cathode has a flat surface perpendicular to said beam axis and said electron beam is primarily emitted from substantially the entire area of said flat surface, said flat emitting surface exposing a crystal plane having a work function equal to or less than the work function of the (111) crystal plane, said flat surface having a shape corresponding to some degree with the shape of said emitted electron beam.

21. Apparatus as defined in claim 20 wherein said flat emitting surface has a non-circular shape.

22. Apparatus as defined in claim 21 wherein said flat emitting surface has a square shape.

23. Apparatus as defined in claim 20 wherein said flat emitting surface exposes a crystal plane selected from the group of crystal planes consisting of the (100), (110), (111), (321), (210), and (311) crystal planes.

24. Apparatus as defined in claim 20 wherein said flat emitting surface exposes a crystal plane selected from the group of crystal planes consisting of the (100), (110), (210), and (321) crystal planes.

25. Apparatus as defined in claim 20 wherein electron emission from the surface regions of the cathode adjacent to said flat emitting surface is suppressed.

26. Apparatus as defined in claim 25 wherein electron emission from surface regions of the cathode adjacent to said flat emitting surface is suppressed by orienting said adjacent surface regions oblique to said flat emitting surface.

27. Apparatus as defined in claim 26 wherein said adjacent surface regions are oriented at least 45 degrees from said flat emitting surface.

28. Apparatus as defined in claim 27 wherein said adjacent surface regions are primarily flat regions.

29. Apparatus as defined in claim 28 wherein said adjacent flat surface regions expose crystal planes having relatively high work functions.

30. Apparatus as defined in claim 29 wherein a relatively high work function is a work function more than the average work function for sintered lanthanum hexaboride.

31. Apparatus as defined in claim 20 wherein the emitting tip of said single crystal lanthanum hexaboride cathode has the shape of a truncated pyramid.

32. Apparatus as defined in claim 31 wherein said pyramid has four sides and a flat apex, said apex being the said flat emitting surface.

33. Apparatus as defined in claim 32 wherein said flat apex surface exposes a (100) crystal plane and the side surface of said pyramid expose (755) crystal planes.

34. Apparatus as defined in claim 20 and further charaterized in that the emitted electron beam has a substantially uniform intensity distribution over the shaped region of said beam.

35. Apparatus as defined in claim 34 and further characterized in that the emitted electron beam has a substantially uniform angular distribution over the shaped region of said beam.

36. Apparatus as defined in claim 20 wherein said emitted electron beam has an intensity distribution which is non-gaussian.

37. Apparatus as defined in claim 20 wherein said emitted beam is further shaped by passing said beam through a shaped aperture.

38. Apparatus as defined in claim 37 wherein said shaped aperture has the same shape and about the same size as the shaped region of said emitted electron beam and is similarly oriented such that said shaped aperture tends to block electrons which are not within the shaped region of said beam.

39. A method of shaping the electron beam emitted from a single crystal lanthanum hexaboride cahtode, comprising the steps of:
    forming a flat surface on the emitting tip of the single crystal lanthanum hexaboride cathode, said flat surface having a shape corresponding with the desired shape of the emitted electron beam;
    operating the single crystal lanthanum hexaboride single crystal cathode at conditions such that an electron beam is emitted primarily from substantially the entire area of said flat surface, said flat surface exposing a crystal plane having a work function equal to or less than the work function of the (111) crystal plane.

40. A method as defined in claim 39 wherein the shape of said flat surface is non-circular.

41. A method as defined in claim 40 wherein the shape of said flat surface is square.

42. A method as defined in claim 39 wherein said flat surface exposes a crystal plane selected from the group of crystal planes consisting of the (100), (110), (111), (321), (210), and (311) crystal planes.

43. A method as defined in claim 39 wherein said flat surface exposes a crystal plane selected from a group of crystal planes consisting of the (100), (110), (210), and (321) crystal planes.

44. A method as defind in claim 39 wherein electron emission from the surface regions of the cathode adjacent to said flat emitting surface is suppressed.

45. A method as defined in claim 44 wherein electron emission from surface regions of the cathode adjacent to said flat emitting surface is suppressed by orienting said adjacent surface regions oblique to said flat emitting surface.

46. A method as defined in claim 45 wherein said adjacent surface regions are oriented at least 45 degrees from said flat emitting surface.

47. A method as defined in claim 46 wherein said adjacent surface regions are primarily flat regions.

48. A method as defined in claim 47 wherein said adjacent flat surface regions expose crystal planes havin relatively high work functions.

49. A method as defined in claim 48 wherein a relatively high work function is a work function more than the average work function for sintered lanthanum hexaboride.

50. A method as defined in claim 39 wherein the emitting tip of said single crystal lanthanum hexaboride cathode has the shape of a truncated pyramid.

51. A method as defined in claim 50 wherein said pyramid has four sides and a flat apex, said apex being the said flat emitting surface.

52. A method as defined in claim 51 wherein said flat apex surface exposes a (100) crystal plane and the side surface of said pyramid expose (755) crystal planes.

53. A method as defined in claim 39 and further characterized in that the emitted electron beam has a substantially uniform intensity distribution over the shaped region of said beam.

54. A method as defined in claim 53 and further characterized in that the emitted electron beam has a substantially uniform angular distribution over the shaped region of said beam.

55. A method as defined in claim 39 wherein said emitted electron beam has an intensity distribution which is non-gaussian.

56. A method as defined in claim 39 wherein said emitted beam is further shaped by passing said beam through a shaped aperture.

57. A method as defined in claim 56 wherein said shaped aperture has the same shape and about the same size as the shaped region of said emitted electron beam and is similarly oriented such that said shaped aperture tends to block electrons which are not within the shaped region of said beam.

* * * * *

UNITED STATES PATENT AND TRADEMARK OFFICE
CERTIFICATE OF CORRECTION

PATENT NO. : 4,468,586  Page 1 of 2
DATED : Aug. 28, 1984
INVENTOR(S) : Fritz-Jurgen Hohn It is certified that error appears in the above-identified patent and that said Letters Patent is hereby corrected as shown below:

Column 1, line 56, "beacuse" should read --because--.

Column 4, line 35, "representative" should read --representation--.

Column 6, line 28, "primarly" should read --primarily--.

Column 6, line 45, "electrode" should read --electron--.

Column 6, line 48, "10" should read --20--.

Column 7, line 43, "20 mm diameter." should read -- 20mm length and 1 mm diameter.--.

Column 9, line 7, "51.-5.5" should read --5.1-5.5--.

Column 9, line 63, "2.4," should read --3.4,--.

Column 12, line 23, "except" should read --expect--.

UNITED STATES PATENT AND TRADEMARK OFFICE
CERTIFICATE OF CORRECTION

PATENT NO. : 4,468,586　　　　　　　　　　Page 2 of 2
DATED　　　 : Aug. 28, 1984
INVENTOR(S) : Fritz-Jurgen Hohn It is certified that error appears in the above-identified patent and that said Letters Patent is hereby corrected as shown below:

IN THE CLAIMS:

Column 15, line 13, "single crystal" should read --single crystal cathode--.

Column 15, line 66, "expose" should read --exposes--.

Column 17, line 29, "cahtode" should read --cathode--.

Column 18, line 3, "defind" should read --defined--.

Column 18, line 17, "havin" should read --having--.

Column 18, line 31, "expose" should read --exposes--.

Signed and Sealed this

Third Day of December 1985

[SEAL]

Attest:

DONALD J. QUIGG

Attesting Officer　　Commissioner of Patents and Trademarks